(12) United States Patent
Farrell et al.

(10) Patent No.: US 7,771,157 B2
(45) Date of Patent: Aug. 10, 2010

(54) BI-DIRECTIONAL WAFER TRANSFER MECHANISM AND METHOD

(75) Inventors: Curtis E. Farrell, Tucson, AZ (US); Dennis D. Liu, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 2011 days.

(21) Appl. No.: 10/034,788

(22) Filed: Dec. 27, 2001

(65) Prior Publication Data

US 2003/0123963 A1 Jul. 3, 2003

(51) Int. Cl.
 *B65G 65/34* (2006.01)
(52) U.S. Cl. .................. 414/811; 414/404
(58) Field of Classification Search .......... 414/404, 414/811

See application file for complete search history.

(56) References Cited

U.S. PATENT DOCUMENTS

| 5,246,218 | A | * | 9/1993 | Yap et al. ............... 269/309 |
| 5,730,575 | A | * | 3/1998 | Nichols et al. ............ 414/404 |
| 5,735,662 | A | * | 4/1998 | Nichols et al. ......... 414/331.16 |
| 5,975,836 | A | * | 11/1999 | Rodriguez ................ 414/787 |
| 6,368,044 | B1 | * | 4/2002 | Nichols et al. ............ 414/404 |
| 6,543,982 | B1 | * | 4/2003 | Nichols et al. ......... 414/331.16 |
| 2002/0098067 | A1 | * | 7/2002 | De Luna, Jr. et al. ....... 414/404 |

OTHER PUBLICATIONS

"Horizontal Wafer Transfer Machines", Handling tools and equipment for the semiconductor industry since 1975!, H-Square Corporation, Sunnyvale, California, pp. 8-1-8-5.

"E.T. 1000 Wafer Transfer System", "E.T. 2000 Wafer Transfer System", and "Ergonomic Wafer Transfer System", MGI Electronics, Tempe, Arizona.

* cited by examiner

*Primary Examiner*—Charles A Fox
(74) *Attorney, Agent, or Firm*—Warren L. Franz; Wade J. Brady, III; Frederick J. Telecky, Jr.

(57) ABSTRACT

A wafer transfer machine transfers wafers from either of a first wafer cassette (55) and a second wafer cassette (56) having incompatible registration features into the other, and includes a support plate (30) having a top surface (38) for supporting the first and second wafer cassette. A first and second registration bosses attached to the top surface extend upward into registration features of the first and second wafer cassette, respectively. A carriage (1) is supported by and movable in opposite directions along a track mechanism (41A,B) that is attached in fixed relationship to the support plate (30). First and second wafer pushing members (10A,B) are supported by the carriage. Each wafer pushing member can be moved to push wafers in one of the wafer cassettes into the other by moving the carriage in one direction or the other.

2 Claims, 4 Drawing Sheets

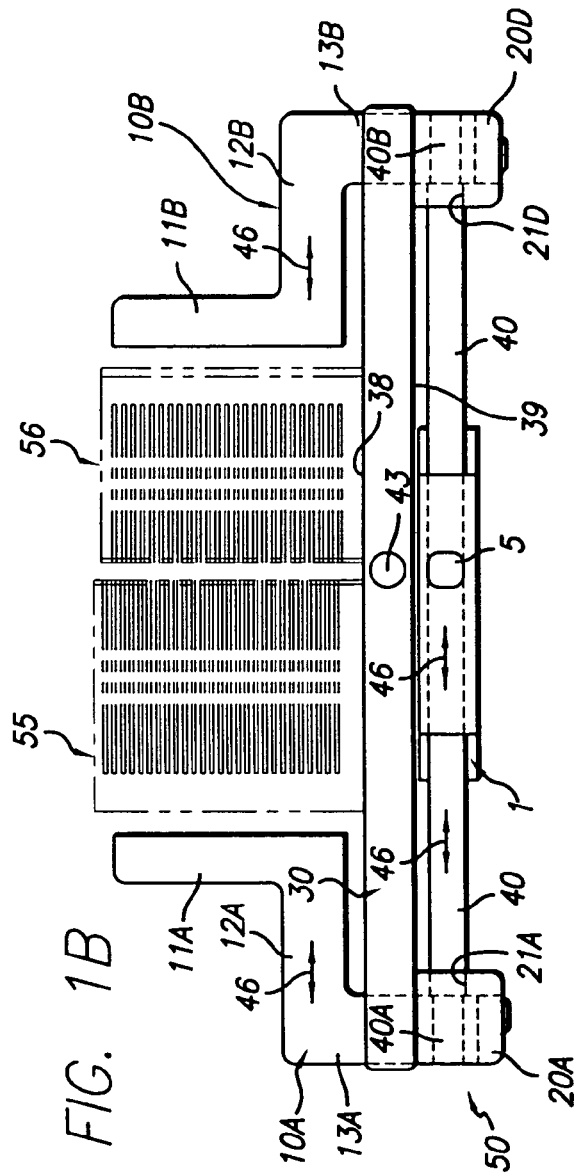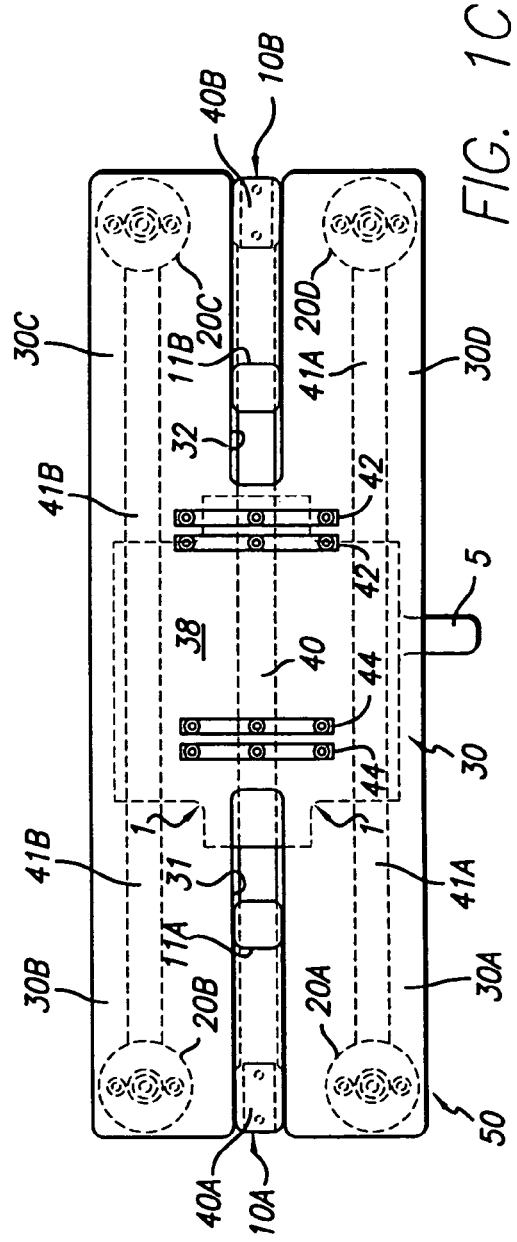

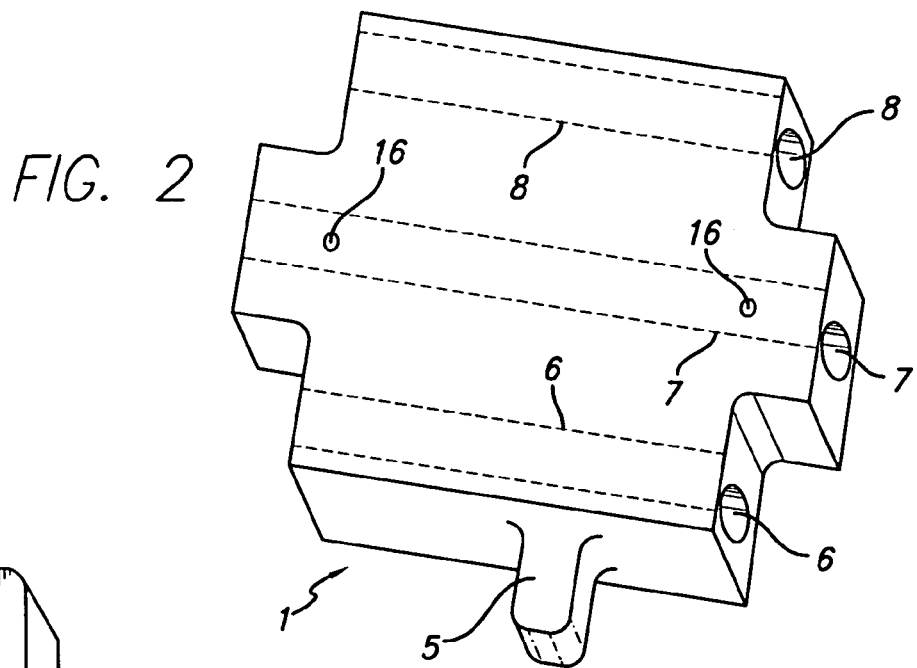
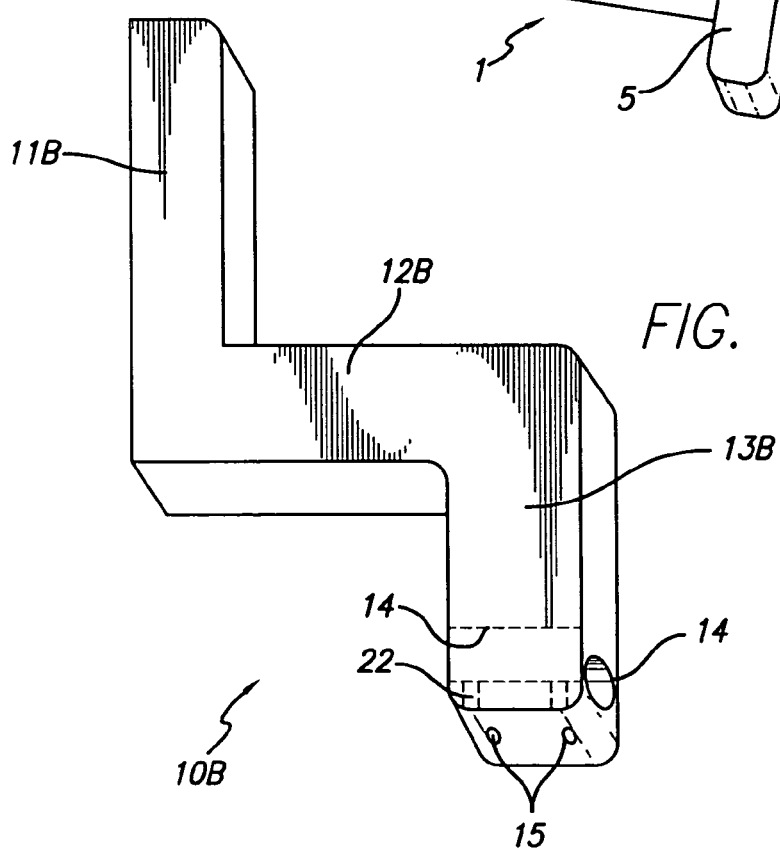
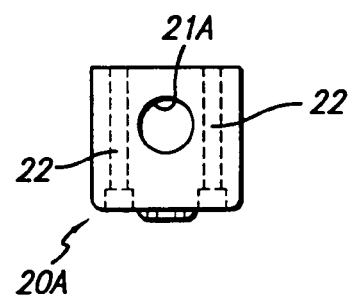

BI-DIRECTIONAL WAFER TRANSFER MECHANISM AND METHOD

BACKGROUND OF THE INVENTION

The present invention relates to a wafer cassette transfer machine and method for transferring semiconductor wafers between wafer cassettes having different registration mechanisms.

In present semiconductor wafer processing systems, all of the wafer cassettes ordinarily utilized in a particular processing system have the same registration features on their bottom surfaces for properly aligning the wafer cassettes on a support surface of a "one-way" the wafer transfer machine. The one-way wafer transfer machine includes a mechanism having a "plunger" or wafer-pushing member that engages the edges of, for example, 25 wafers in a loaded wafer cassette and pushes all of the wafers therein simultaneously into an adjacent, precisely aligned empty standard wafer cassette. Wafer transfer machines must be designed using structures and materials which are compatible with a wafer fabrication environment and avoid any risk of semiconductor wafer breakage, and also avoid any kind of friction that generates minute "particulates" which can become airborne and then become deposited on the surfaces of the semiconductor wafers. This is because such particulates can cause processing defects that result in malfunction of the integrated circuits formed thereon.

There is a known anodized aluminum wafer cassette for high-temperature wafer processing (hereinafter referred to as the "ASM high-temperature cassette") manufactured by Advanced Semiconductor Manufacturing, Inc. and specially designed for high-temperature wafer processing in certain reactors manufactured by the same company. In some cases, it may be desirable to use the high temperature anodized aluminum wafer cassettes for carrying semiconductor wafers during high-temperature processing operations, and to use "semi-standard" PFA Teflon cassettes (hereinafter referred to simply as "Teflon cassettes") for carrying the same wafers during other low temperature processing operations. ("Semi-standard" cassettes also can be made of other plastic material, such as polyethylene or polypropylene, that is suitable for the wafer fabrication environment.) However, the PFA Teflon cassettes and the ASM high-temperature cassettes have different bottom registration features. Consequently, the ASM high-temperature cassettes cannot be used in any single available wafer transfer machine to transfer semiconductor wafers from either (1) the "semi-standard" PFA Teflon cassettes into the ASM high-temperature cassettes or (2) the ASM high-temperature cassettes into the PFA Teflon cassettes. Instead, two separate wafer transfer machines are required. There has been no practical, fast, economical way of accomplishing the two foregoing kinds of wafer transfer operations when it is desirable to use both kinds of cassettes. Also, automated robotic systems that transfer only one wafer at a time was known in the art.

Thus, there is an unmet need to avoid the expense, inconvenience, and space required to use two separate wafer transfer machines to accomplish transfer of wafers in either direction between two different kinds of cassettes, especially cassettes having incompatible registration features. Consequently, there is an unmet need for a single inexpensive wafer transfer machine and method that can rapidly accomplish simultaneous transfer of an entire cassette load of wafers in a single pass between two different kinds of cassettes having incompatible registration features.

SUMMARY OF THE INVENTION

It is an object of the present invention to avoid the need to use two separate wafer transfer machines to accomplish transfer of semiconductor wafers between wafer cassettes having incompatible registration features.

It is another object of the present invention to reduce the cost of wafer transfer machines required to accomplish transfer of semiconductor wafers in both directions between wafer cassettes having incompatible registration features.

It is another object of the present invention to increase the speed of transferring semiconductor wafers between wafer cassettes having incompatible registration features.

Briefly described, and in accordance with one embodiment, the present invention provides a wafer transfer machine for transferring wafers from either of a first wafer cassette (55) and a second wafer cassette (56), especially if they have incompatible registration features, into the other wafer cassette. The described wafer transfer machine includes a support plate or structure (30) having a support surface (38) for supporting the first and second wafer cassette. A first registration feature (44) is attached in fixed relationship to the support surface for engaging a registration feature of the first wafer cassette, and a second registration feature (42) is attached in fixed relationship to the top surface for engaging a registration feature of the second wafer cassette. A carriage (1) is supported by and is movable in opposite directions along a track mechanism (41A,B) that is attached in fixed relationship to the support plate (30). A first wafer pushing member (10A) is rigidly connected to the carriage (1) for engaging edges of semiconductor wafers in the first wafer cassette (55) and pushing them out of the first wafer cassette (55) into the second wafer cassette (56). A second wafer pushing member (10B) also is rigidly connected to the carriage (1) for engaging edges of semiconductor wafers in the second wafer cassette (56) and pushing them out of the second wafer cassette (56) into the first wafer cassette (55).

In the described embodiment, a handle (5) is attached to the carriage for manually moving the carriage along the track mechanism to cause one of the first and second wafer pushing members to push wafers from one of the first and second wafer cassettes into the other. An alignment knob (43) is attached to an edge of the support structure (30) in a location aligned with the handle (5) when the carriage is located at a center position which allows placing of the first and second wafer cassettes in engagement with the first and second registration features, respectively, and allows removal of the first and second wafer cassettes from the support structure. The track mechanism includes first (41A) and second (41B) slide rods, and the carriage (1) includes parallel first (6) and second (8) bores through which the first and second slide rods, respectively, extend to allow bidirectional sliding of the carriage along the first and second slide rods. The support plate (30) includes a first elongated slot (31) through which the first wafer pushing member (10A) extends upward to a level of wafers supported in the first wafer cassette (55) and a second elongated slot (32) through which the first wafer pushing member (10B) extends upward to a level of wafers supported in the second wafer cassette (56). The first and second wafer pushing members are supported by opposite ends of a push-pull rod (40) extending through the third cylindrical hole (7) of the carriage (1) and rigidly attached to the carriage. In the described embodiment, first (20A), second (20B), third (20C), and fourth (20D) legs support first, second, third, and fourth corner portions of the support plate (30), respectively, wherein opposite ends of the first slide rod (41A) engage and are supported by the first (20A) and fourth (20D) legs, respectively, and wherein opposite ends of the second slide rod (41B) engage and are supported by the second (20B) and third (20C) legs, respectively.

In operation, the carriage (1) is moved in a direction that causes one of the first wafer pushing member (10A) and the second wafer pushing member (10B) which is closest to the semiconductor wafers in the loaded wafer cassette to engage the edges of the semiconductor wafers and push them out of the loaded wafer cassette into the empty wafer cassette. Then the carriage is moved to a centered position that allows removal of the first and second wafer cassettes from the support plate.

BRIEF DESCRIPTION OF THE DRAWINGS

FIG. 1B is a front elevation view of the wafer cassette transfer machine of FIG. 1A.

FIG. 1C is the top plan view of the wafer cassette transfer machine of FIG. 1A.

FIG. 2 is a top perspective view of a carriage included in the embodiment of FIGS. 1A-C.

FIG. 3 is perspective view of a right plunger included in the embodiment of FIGS. 1A-C.

FIG. 4 is an elevation view of one leg of the wafer cassette transfer machine shown in FIGS. 1A-C.

DETAILED DESCRIPTION OF THE PREFERRED EMBODIMENTS

Figure 1A:
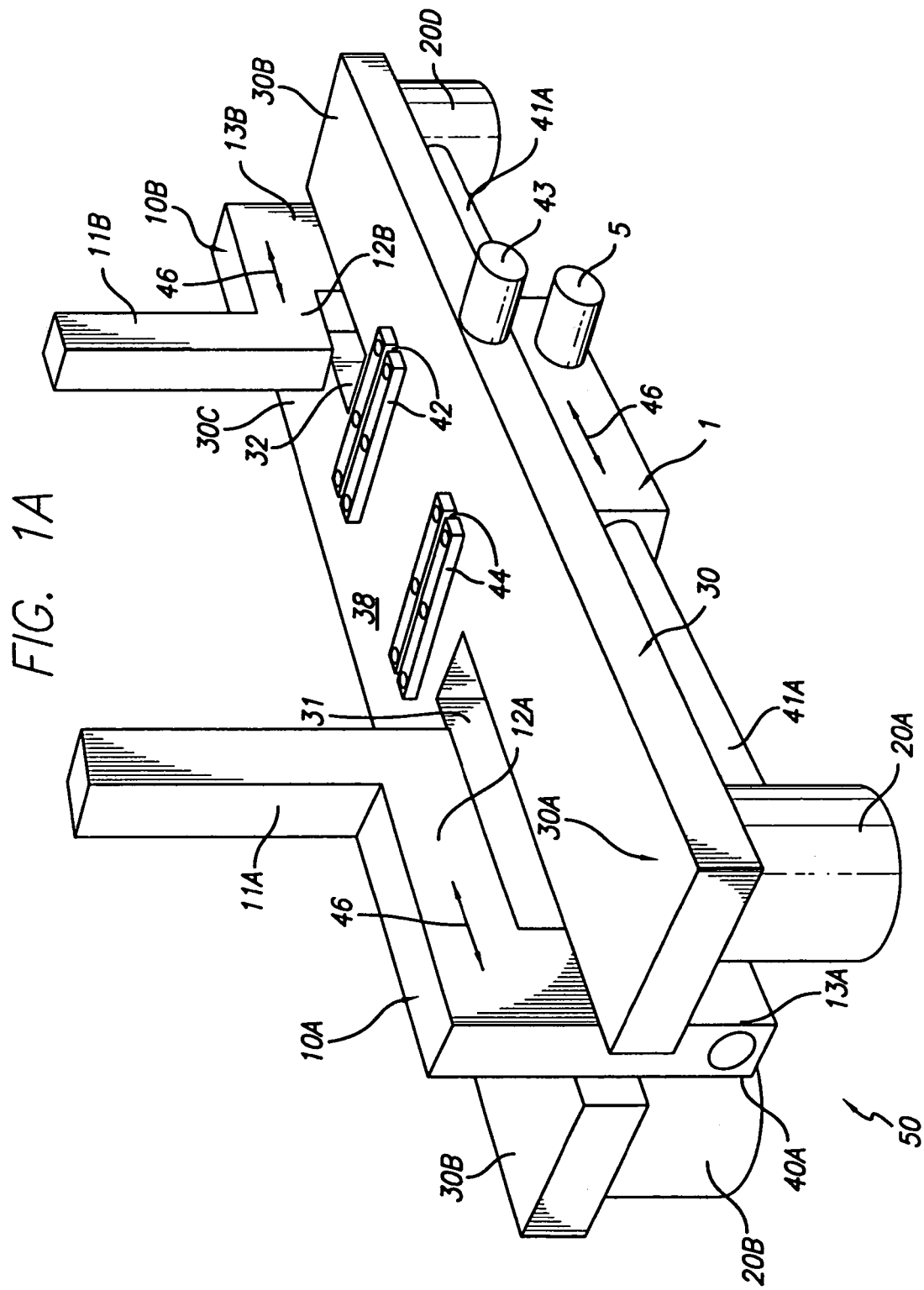
FIG. 1A is a partial cutaway perspective view of the wafer cassette transfer machine of the present invention.

Referring to the drawings, especially FIGS. 1A-C, wafer transfer machine 50 includes an H-shaped support plate 30 having a top surface 38 and a bottom surface 39. Four legs 20A-D are attached to the bottom surface 39 at the four corners, respectively, of support plate 30. A first horizontal cylindrical slide rod 41A extends between leg 20A and leg 20D. Each leg is cylindrical, and includes a transverse precision cylindrical bore 21 of the same diameter as the diameter of slide rod 41A, so the opposite ends of slide rod 41A extend into the precision bores 21A and 21D as shown in FIG. 1B, and therefore are supported between leg 20A and leg 20D. Similarly, a second cylindrical slide rod 41B extends between and is supported by leg 20B and leg 20C.

Support plate 30 includes an H-shaped structure having a precisely flat top surface 38, and which also includes 4 sections 30A, 30B, 30C and 30D. An elongated rectangular slot 31 separates sections 30A and 30B, and an identical but symmetrically opposite slot 32 separates sections 30C and 30D. Threaded holes 33 are provided in the bottom surface of support plate 30 near the outer ends of each of sections 30A-D to allow attachment of legs 20A-D to the bottom surface of each of the sections 30A-D, respectively. Threaded holes (not shown) in the top surface of support plate 30 allow rigid attachment of two low temperature cassette registration bars 44 and two high-temperature cassette registration bars 42 to the top surface of support plate 30 by means of suitable screws. Registration bars 44 are of slightly differently length than registration bars 42, so as to precisely match the inside spacings between the side walls of ASM high-temperature cassettes 55 and PFA Teflon cassettes 56, respectively. Each of ASM high-temperature cassettes 55 and PFA Teflon cassettes 56 has a corresponding bottom cross bar (not shown) extending between its sidewalls, respectively. The bottom cross bar fits precisely between the corresponding pair of registration bars 42 or 44. A threaded hole 34 in the vertical front surface of support plate 30 allows attachment of alignment knob 43 thereto by means of a suitable screw.

A polypropylene carriage 1 includes two parallel precision bores through which cylindrical slide rods 41A and 41B pass, such that carriage 1 is supported underneath the bottom surface of support plate 30. Carriage 1 can easily slide along rods 41A and 41B as indicated by arrows 46.

Carriage 1 includes a third bore 7 through which a push-pull rod 40 extends. Push-pull rod 40 is rigidly attached to carriage 1 by means of suitable threaded holes and screws (not shown). The opposite ends 40A and 40B of push-pull rod 40 have their diameters reduced from that of the main body of push-pull rod 40. Opposite ends 40A and 40B extend into corresponding openings of a left plunger 10A and a right plunger 10B, respectively. Left plunger 10A thereby has its lower end rigidly attached to the left end of push-pull rod 40, and extends upward through the above mentioned rectangular slot 31 in the left portion of support plate 30. Similarly, right plunger 10B has its lower end rigidly attached to the right end of push-pull rod 40, and extends upward through above mentioned rectangular slot 32 in the right portion of support plate 30.

If carriage 1 is "centered" so that handle 5 is aligned with alignment knob 43, then an anodized aluminum high-temperature wafer cassette 55, which can be either empty or loaded with, for example, 25 wafers, is placed on the upper surface 38 of support plate 30 between left plunger 10A and right plunger 10B. This is done such that registration bars 44 are precisely aligned with and engage a bottom cross bar (not shown) in the bottom of ASM high-temperature cassette 55. Similarly, a "semi-standard" PFA Teflon low temperature wafer cassette 56, which can be either empty or loaded with 25 wafers, is placed on the upper surface 38 of support plate 30 between left plunger 10A and right plunger 10B so that registration bars 42 are precisely aligned with and engage a bottom cross bar (not shown) in the bottom of PFA Teflon cassette 56. Thus, registration bars 44 accommodate only an ASM high-temperature cassette 55, and registration bars 42 accommodate only a semi-standard PFA Teflon cassette 56.

FIG. 2 shows the details of carriage 1. Referring to FIG. 2, carriage 1 includes a generally rectangular main body having above mentioned handle 5 extending horizontally outward from its front vertical surface. Handle 5 allows an operator to move carriage 1 to the right or to the left along slide rods 41A and 41B. Three precision parallel longitudinal cylindrical bores 6, 7 and 8 extend entirely through carriage 1, bore 7 being positioned midway between bores 6 and 8. Carriage 1 is supported by, and is slidable along slide rods 41A and 41B, which extend through bores 6 and 8. A single push-pull rod 40 extends through bore 7 and is rigidly connected to carriage 1 by means of a pair of set screws (not shown) extending through a pair of threaded holes 16 so as to tightly engage push-pull rod 40.

FIG. 3 shows the details of two identical plungers 10A and 10B, which are oriented in the opposite directions as illustrated in FIGS. 1A-C. Referring to FIGS. 1B and 3, plungers 10A and 10B include lower vertical sections 13A and 13B, respectively. The upper ends of sections 13A and 13B are connected to one end of integral horizontal sections 12A and 12B, respectively. The other ends of horizontal sections 12A and 12B are connected to the lower ends of integral, vertical wafer-pushing sections 11A and 11B, respectively. A horizontal bore 14 extends through the bottom portion of each of sections 13A and 13B. The opposite ends 40A and 40B of push-pull rod 40 extend into the bore 14 of each of sections 13A and 13B, respectively. A pair of vertical threaded holes 15 extend upward into the bottom surfaces of sections 13A and 13B receive set screws which are tightened to rigidly attach each of plungers 10A and 10B to the opposite ends 40A and 40B of push-pull rod 40.

FIG. 4 shows the details of leg 20A, which is identical to the other three legs. Leg 20A includes a pair of holes 22 for receiving screws (not shown) to be threaded into holes (not shown) on the bottom surface of support plate 30. Leg 20 has a precision horizontal bore 21 extending halfway through that leg, for receiving an end of one of the slide rods 41.

Figure 5:
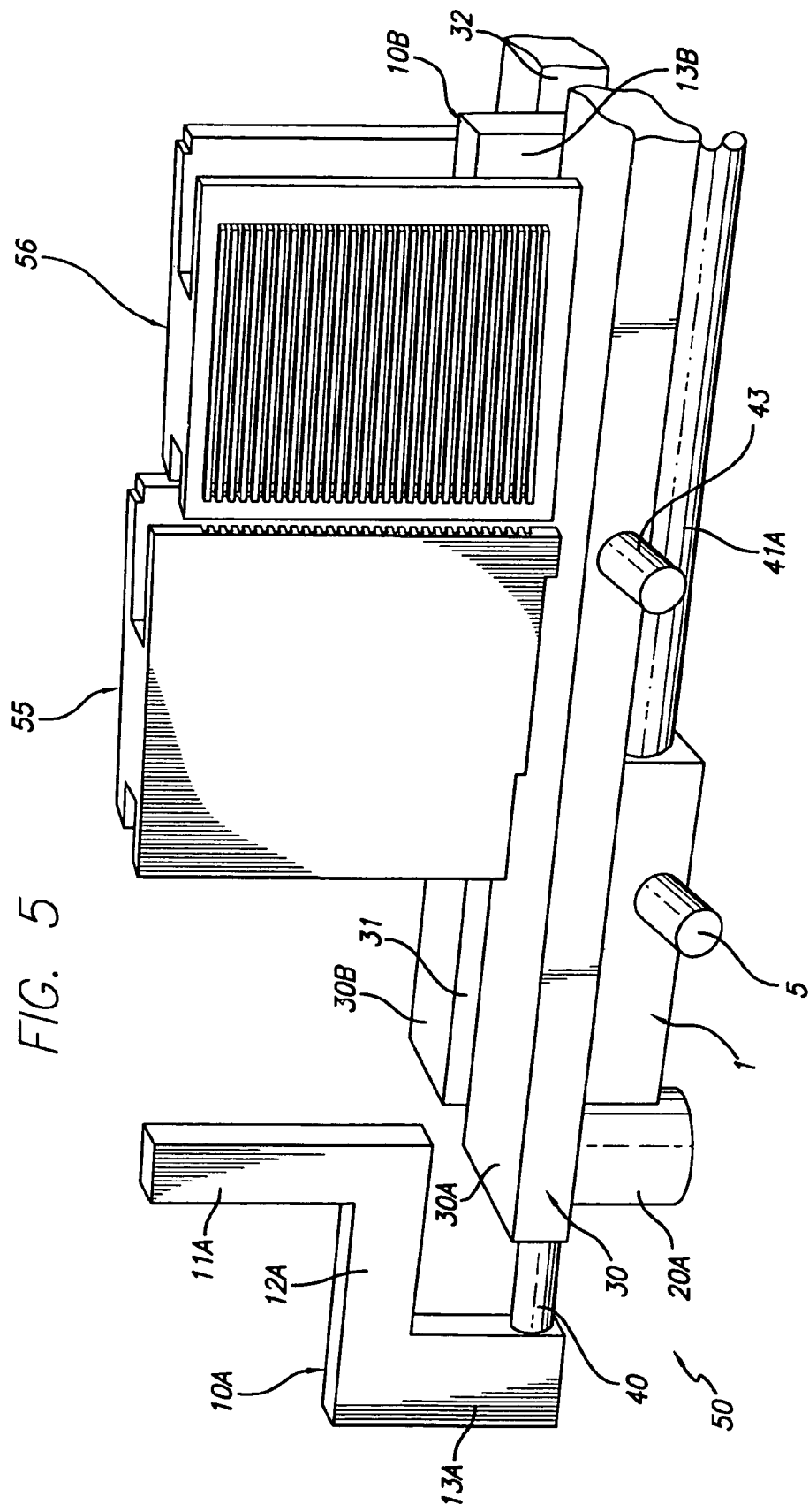
FIG. 5 is a partial front perspective view of the wafer transfer machine with both a high temperature wafer cassette and a low temperature wafer cassette registered in place, being operated to transfer wafers from the low temperature wafer cassette into the high temperature wafer cassette.

FIG. 5 shows a partial perspective view of wafer transfer machine 50 with an empty high temperature cassette 55 and a wafer-loaded PFA Teflon cassette 56 properly registered on upper surface 38 of support plate 30. As illustrated, carriage 1 has been pushed as far left as possible to cause plunger 10B to move to the left, into PFA Teflon cassette 56 so as to push all of the semiconductor wafers therein into ASM high-temperature cassette 55 (which also causes plunger 10A to move to the left as shown). However, if ASM high-temperature cassette 55 is initially loaded with wafers and PFA Teflon cassette 56 is initially empty, then carriage 1 would be pushed as far to the right as possible, moving plunger 10A to the right into ASM high-temperature cassette 55 and pushing the wafers into PFA Teflon cassette 56 (which would also cause plunger 10B to move to the right). After the semiconductor wafers have been transferred from one wafer cassette to the other, then carriage 1 is centered so that handle 5 is aligned with alignment knob 43. Then both cassettes can be removed from surface 38 and another pair of cassettes can be properly registered thereon so that another wafer transfer can be performed from either of the cassettes into the other.

Most of the components in a present prototype implementation of wafer transfer machine 50 are composed of polypropylene, except that carriage 1 is composed of Teflon material, in order to provide very low sliding friction on polypropylene slide rods 41A and 41B.

Thus, the invention provides a single low cost wafer transfer machine of relatively simple construction which is capable of bidirectional transfer of wafers between two cassettes having incompatible registration features, such as a high temperature aluminum wafer cassette and a low temperature Teflon wafer cassette. The invention therefore avoids the expense, inconvenience, and space required to use two separate wafer transfer machines to accomplish transfer of wafers in either direction between two different kinds of cassettes having incompatible registration features.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, various other plastic or non-plastic materials which are compatible with a wafer fabrication environment could be utilized for the various components. For example, slide rods 41A and 41B could be composed of Teflon-coated metal or Teflon-coated ceramic material. The configuration of support plate 30 could be different than what is shown in the drawings. Support plate 30 and slide rods 41A and 41B could be supported differently than by means of legs 20A-D. Various other track mechanisms than slide rods 41A and 41B could be utilized to support carriage 1. The plungers 10A and 10B could be supported on separate carriages that can move separately. Also, plungers 10A and 10B could be operated by separate hydraulic or pneumatic mechanisms, rather than being carried by the single carriage 1 on the single track formed by slide bars 41A and 41B. Registration bars 42 and 44 could be integral with support plate 30 rather than being attached thereto by screws. Furthermore, different alternative registration features could readily be provided to mate with different corresponding registration features of the wafer cassettes. For example, a portion of the support surface of support plate 30 could be recessed and precisely matched to peripheral edge features of the bottom of each wafer cassette to ensure its proper registration. Different registration features than rectangular registration bars 42 and 44 could be used. If bidirectional transfer of wafers between different cassettes having identical bottom registration features is desired, then identical registration features can be used for registration of both cassettes. A variation of wafer transfer machine 50 could include an automatic or semi-automatic robotic device that could be used to move carriage 1. The variation of wafer transfer machine 50 also could be incorporated into another wafer fabrication device or system.

What is claimed is:

1. A method of transferring wafers from either of a first wafer cassette and a second wafer cassette having incompatible registration features into the other wafer cassette, comprising:

(a) supporting the first wafer cassette on a support plate in registration with a first registration boss extending into and engaging a first registration feature of the first wafer cassette, and supporting the second wafer cassette on the support plate in registration with a second registration boss extending into and engaging a second registration feature of the second wafer cassette, one of the first and second wafer cassettes being loaded with semiconductor wafers and the other of the first and second wafer cassettes being empty;

wherein said first registration feature is incompatible with said second registration feature;

(b) supporting a first wafer pushing member and a second wafer pushing member by means of a carriage supported by and movable in opposite directions along a track mechanism; and (c) moving the carriage in a direction that causes one of the first wafer pushing member and the second wafer pushing member which is closest to the semiconductor wafers in the loaded wafer cassette to engage the edges of the semiconductor wafers and push them out of the loaded wafer cassette into the empty wafer cassette.

2. The method of claim 1 further including moving the carriage to a centered position that allows removal of the first and second wafer cassettes from the support plate.

* * * * *